United States Patent
Yin et al.

(10) Patent No.: US 8,519,364 B1
(45) Date of Patent: Aug. 27, 2013

(54) POSITIONING SYSTEM AND METHOD FOR PRECISE STAGE AND PATTERN USED THEROF

(75) Inventors: Gung-Chian Yin, Hsin-chu (TW); Te-Hui Lee, Hsin-chu (TW)

(73) Assignee: National Synchrontron Radiation Research Center, Hsin-chu (TW)

( * ) Notice: Subject to any disclaimer, the term of this patent is extended or adjusted under 35 U.S.C. 154(b) by 0 days.

(21) Appl. No.: 13/441,473

(22) Filed: Apr. 6, 2012

(30) Foreign Application Priority Data

Feb. 10, 2012 (TW) ............... 101104332 A

(51) Int. Cl.
  *G01J 1/00* (2006.01)
  *G01N 21/00* (2006.01)
(52) U.S. Cl.
  USPC ............ 250/491.1; 250/307; 250/492.2; 250/492.23; 250/397
(58) Field of Classification Search
  USPC ............ 250/491.1, 307, 492.22, 492.23, 250/397
  See application file for complete search history.

(56) References Cited

U.S. PATENT DOCUMENTS

| | | | |
|---|---|---|---|
| 5,404,019 A * | 4/1995 | Ohno et al. | 250/492.23 |
| 6,242,751 B1 * | 6/2001 | Takemoto et al. | 250/492.22 |
| 6,420,700 B2 * | 7/2002 | Ooaeh et al. | 250/252.1 |

\* cited by examiner

*Primary Examiner* — Jack Berman
*Assistant Examiner* — Meenakshi Sahu
(74) *Attorney, Agent, or Firm* — Muncy, Geissler, Olds & Lowe, PLLC

(57) ABSTRACT

A positioning system for precise stage is provided. It includes a designed pattern on a stage; an electron beam column generating a focused electron beam to scan the designed pattern and produce electron signal; an electron detection unit to detect the electronic signal; and a control unit converting the electron signal to a clock signal to determine the relative position of the electron beam column and the designed pattern, so as to adjust the displacement of the stage. A nanometer scale positioning method for a precise stage is provided, which can resolve the problem of mechanical drift of the stage when the stage is multi-axis positioning or rotating.

23 Claims, 7 Drawing Sheets

POSITIONING SYSTEM AND METHOD FOR PRECISE STAGE AND PATTERN USED THEROF

BACKGROUND OF THE INVENTION

1. Field of the Invention

The present invention relates to a positioning system and method for a precise stage and more particularly to a positioning system and method for a precise stage by means of electron beam scanning.

2. Description of the Prior Art

With requirements of high precision for industrial machinery and measuring instruments, development of precision machinery, semiconductor industry, micron technology or nanotechnology all emphasize on micronization and precision, wherein positioning technique and instruments with high precision are necessary for processing machinery, semiconductor fabrication and electronic information device.

Generally, when a high precision stage is rotating or multi-axis positioning, it may lead to a problem of mechanical drift. The state-of-art solutions and disadvantages thereof are described below:

(1) Using an optical interferometer to detect precision movement of the moving stage for high precision positioning: it cannot be arranged on the rotating axis of the moving stage.

(2) Using an optical scale for calibration: precision thereof is insufficient and it is unable to measure eccentricity of the rotation.

(3) Using a mechanical axis with air bearing: although to 30 nm precision, it must be operated under standard atmosphere and is too large-sized to use in small space.

(4) Using a vacuum gauge for calibration: if the stage is designed for multi-dimensional movement with tilted angle, the mechanical design is very difficult and complex and therefore is unpractical.

SUMMARY OF THE INVENTION

It is an aspect of the present invention to provide a positioning system and method for a precise stage and pattern used thereof, which can be applied to multi-dimensional moving stage with complex structure to nanometer scale and can overcome the problem of mechanical drift when the moving stage is rotating or multi-axis positioning.

According to an embodiment, the positioning system and method for a precise stage comprises: a designed pattern placed on a moving stage, wherein the designed pattern comprises a plurality of gradually wider marks radially arranged with a space therebetween; an electron beam column, for generating a focused electron beam; a scanning unit connected to the electron beam column, for adjusting the focused electron beam to perform two-dimensional pattern scanning over the designed pattern so as to generate a reflected electron signal; an electron detection unit, for detecting the reflected electron signal; and a control unit connected to the moving stage, the electron beam column, the scanning unit and the electron detection unit, wherein the reflected electron signal is generated from the two-dimensional pattern scanning of the focused electron beam over the gradually wider marks and the space therebetween; the reflected electron signal is converted by the control unit to generate a clock signal, and the control unit adjusts the movement of the moving stage according to pulse width of the plurality of the clock signals, wherein the trace of the two-dimensional pattern scanning can be circle or ellipse.

According to another embodiment of the present invention, in a positioning system for a precise stage, a designed pattern is placed on a moving stage and is maintained a constant distance from a specimen placed on the moving stage, wherein the designed pattern comprises: a plurality of gradually wider marks radially arranged with a space therebetween.

According to another embodiment, the positioning method for a precise stage comprises: fixing a designed pattern on a moving stage, wherein the designed pattern comprises a plurality of gradually wider marks radially arranged with a space therebetween; using an electron beam to perform two-dimensional pattern scanning over the designed pattern so as to generate a reflected electron signal; detecting the reflected electron signal; and converting the reflected electron signal to a clock signal, and adjusting the movement of the moving stage according to the designed pattern, two-dimensional pattern scanning and pulse width of the plurality of clock signals.

The objective, technologies, features and advantages of the present invention will become more apparent from the following description in conjunction with the accompanying drawings, wherein certain embodiments of the present invention are set forth by way of illustration and examples.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The detail description is provided below and the preferred embodiments described are only for the purpose of description rather than for limiting the present invention.

Figure 1:
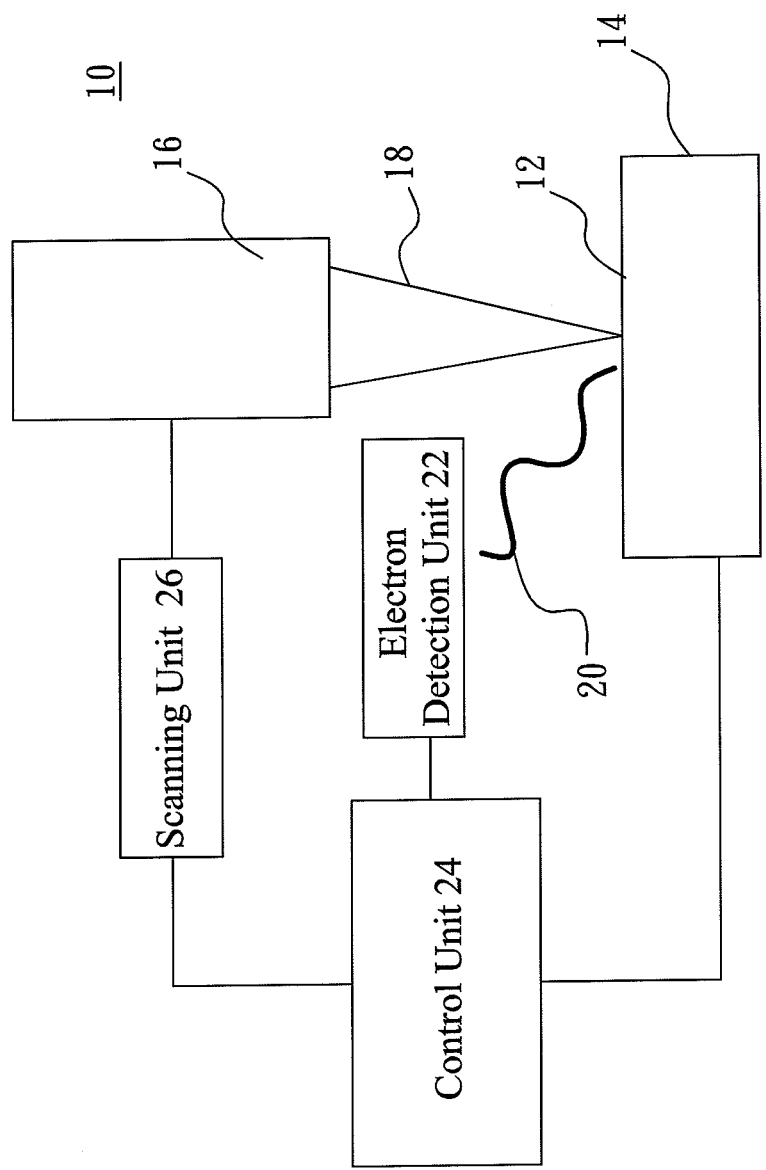
FIG. 1 is a schematic diagram illustrating the positioning system for a precise stage according to an embodiment of the present invention.
Figure 2:
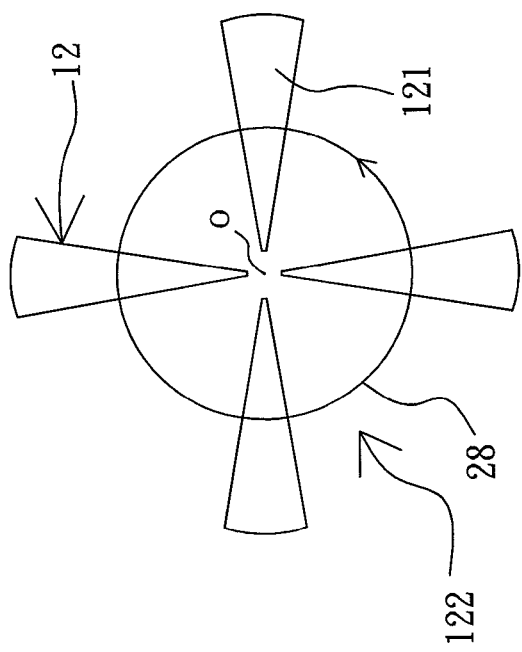
FIG. 2 is a schematic diagram illustrating the designed pattern and the circle trace scanning according to an embodiment of the present invention.

FIG. 1 is a schematic diagram illustrating the structure of the positioning system for a precise stage according to an embodiment of the present invention. As shown in FIG. 1, the positioning system for a precise stage 10 comprises a designed pattern placed on a moving stage 14. Referring to FIG. 2, a schematic diagram illustrating the designed pattern according to one embodiment of the present invention, the designed pattern 12 comprises a plurality of gradually wider marks arranged radially; in one embodiment, there are four gradually wider marks, but not limited to this. The gradually wider mark is a fan-shaped mark 121 and there is a space 122 between two adjacent fan-shaped marks; an electron beam column 16 is arranged above the moving stage 14 for generating a focused electron beam 18 and using a scanning unit 26 to control the focused electron beam 18 to perform two-dimensional pattern scanning over the designed pattern 12 on the moving stage 14 to generate a reflected electron signal 20. In one embodiment, the two-dimensional pattern scanning is circle trace scanning 28 or ellipse trace scanning, but not limited to this. As shown in FIG. 2, the fan-shaped mark 121 and the space 122 are scanned by the circle trace scanning 28; an electron detection unit 22, for detecting scatter electron signal 20 which comprises secondary electron signal and backscattered electron signal, but not limited to this; and a control unit 24 connected to the moving stage 14, the electron beam column 16, the scanning unit 26 and the electron detection unit 22.

In one embodiment, the moving stage 14 comprises a three-axis moving stage and two rotating stages for horizontal rotation and vertical rotation, wherein the moving stage 14 is used for placement of a specimen (not shown in the picture) and the designed pattern 12 is arranged near the specimen with a specific distance so that the displacement of the focused electron beam 18 over the designed pattern 12 is equal to the displacement of the specimen.

Continue the description above, the control unit 24 records the shape of the designed pattern 12 and outputs a control signal for controlling the scanning trace of the scanning unit 26 and further converting the electron signal 20 detected by the detection unit 22 to a clock signal 30 so as to adjust the displacement of the moving stage 14 according to time-varying offset of the designed pattern 12, which can be calculated based on the shape of the designed pattern 12, scanning trace and clock signals.

Figure 3:
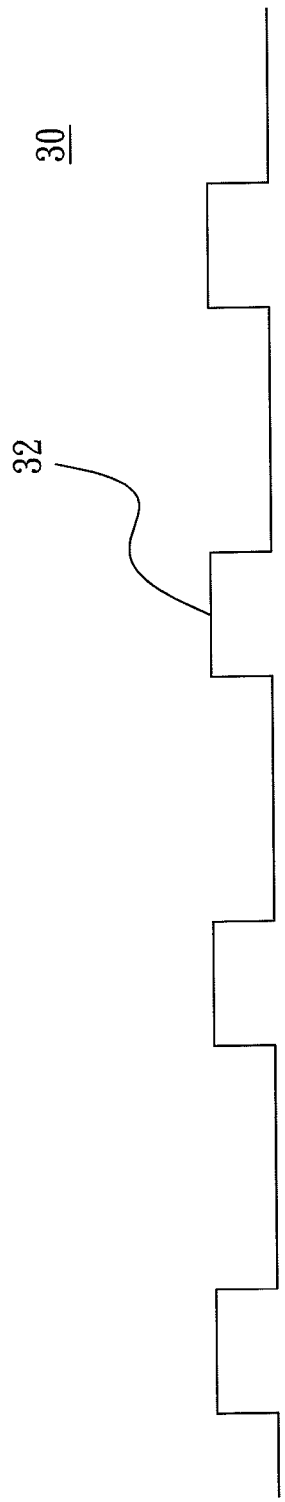
FIG. 3 is a schematic diagram illustrating a clock signal according to an embodiment of the present invention.

In the present invention, because of distinctly different electrical properties between the designed pattern 12 and the space 122, when the electron signal 20 generated from the circle trace scanning 28 of the focused electron beam 18 over the designed pattern 12 is converted to the clock signal 30 by the control unit 24, as shown in FIG. 3, there is high and low voltage change of the clock signal 30. In one embodiment, when the focused electron beam 18 scans over the fan-shaped mark 121, the clock signal 30 appears as a square pulse 32 with high height and width and the digital value is displayed as 1; when the focused electron beam 18 scanned over the space 122 of the designed pattern 12, there is no square pulse 32 fluctuated and the digital value is displayed as 0.

Figure 4:
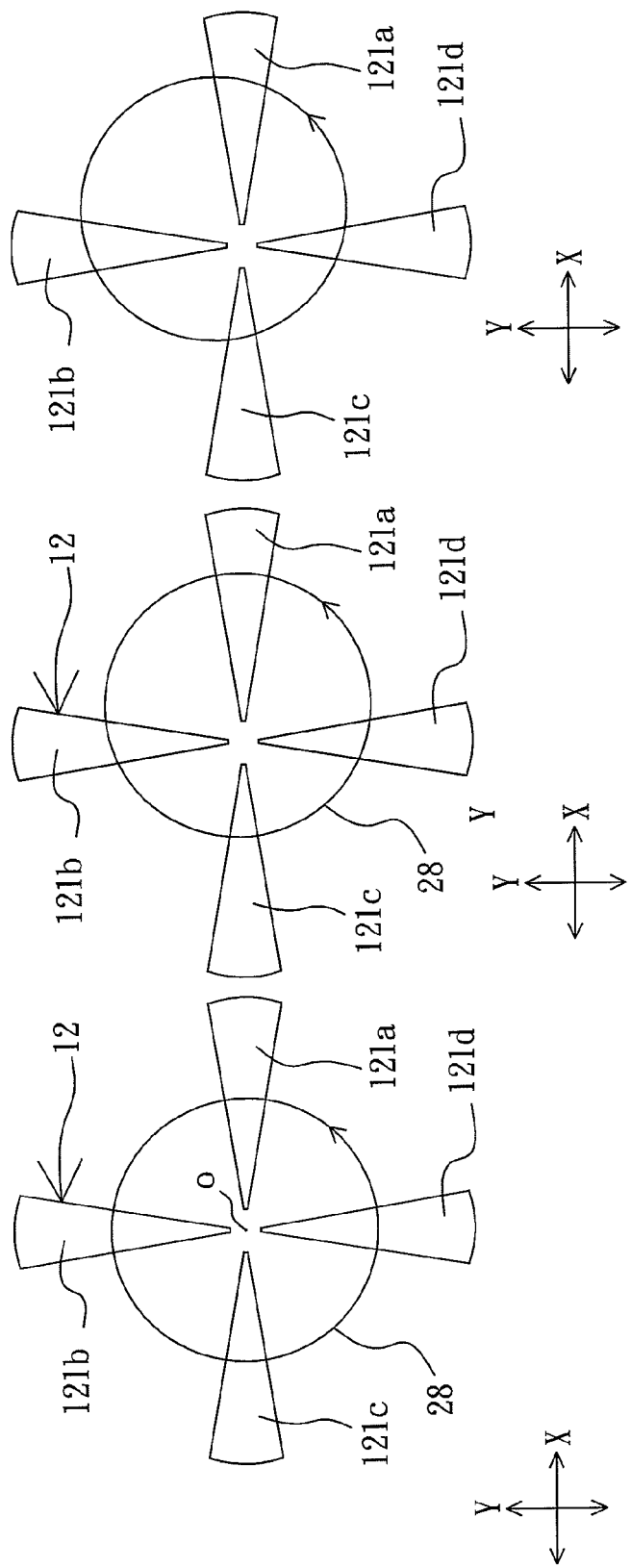
FIG. 4a to FIG. 4c are schematic diagrams illustrating corresponding relationship between the designed patterns and the circle trace scanning according to three embodiments of the present invention.

There are four examples of fan-shaped marks in respect of the designed pattern, which are arranged radially and generate different clock signals based on the offset of the designed pattern. Referring to FIG. 4a, the four fan-shaped marks are respectively marked as the fan-shaped mark 121a, 121b, 121c and 121d. In one embodiment, the fan-shaped mark 121a and 121c, toward the X direction, and the fan-shaped mark 121b and 121d, toward the Y direction, gradually grow wider away from the radiating center o, wherein the fan-shaped mark 121a, 121b, 121c and 121d are arranged with equal space therebetween.

Figure 5:
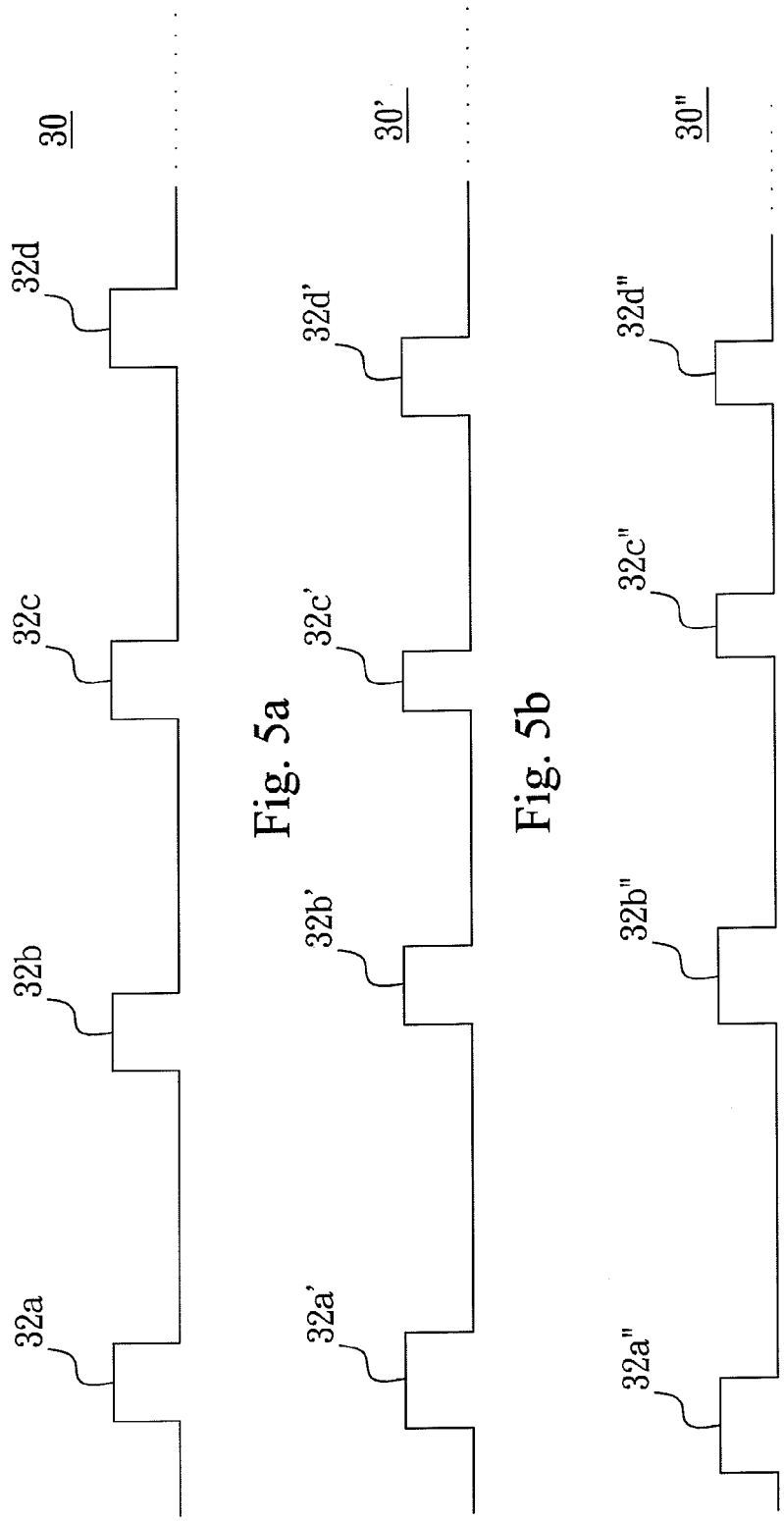
FIG. 5a to FIG. 5c are schematic diagrams illustrating the clock signals generated from circle trace scanning respectively according to FIG. 4a to FIG. 4c.

As shown in FIG. 4a, if the center of the circle trace scanning 28 corresponds to the radiating center o of the four fan-shaped marks 121a, 121b, 121c and 121d, because the scanning trace of the focused electron beam 18 over each fan-shaped mark 121a, 121b, 121c and 121d is the same, the each square pulse 32a, 32b, 32c and 32d of the clock signal 30 as shown in FIG. 5a has equal width and distance therebetween, which means the corresponding relationship between the designed pattern and clock signal is correct and therefore the clock signal is correct.

When there is offset generated to the designed pattern (i.e. generated to the moving stage), the trace of the focused electron beam 18 scanning over the fan-shaped markers 121a, 121b, 121c and 121d changes. Take X direction offset of the designed pattern for example, as shown in FIG. 4b, the traces of the circle trace scanning 28 of the focused electron beam 18 over the fan-shaped marker 121a and 121c are different so that the width of the pulse 32a' and 32c' of the clock signal 30' as shown in FIG. 5b is different and the distance between the adjacent pulse 32a',32b', 32c' and 32d' differ; time-varying offset of the moving stage 14 (as shown in FIG. 1) can be deprived from comparison between the width of the pulse 32a', 32b', 32c' and 32d' of the clock signal 30', and the width of the pulse 32a, 32b, 32c and 32d of the clock signal 30, for adjusting the displacement of the moving stage 14, which makes the designed pattern 12 on the moving stage 14 capable of generating the correct clock signal 30 (as shown in FIG. 5a) when the designed pattern is scanned.

In another embodiment, offset can be generated along the X direction and Y direction. As shown in FIG. 4c, the traces of the circle trace scanning 28 of the focused electron beam 18 over the fan-shaped marker 121a, 121b, 121c and 121d are different, thereby changing the width of the pulse 32a", 32b", 32c" and 32d" of the clock signal 30" (as shown in FIG. 5c); offset along the X direction and Y direction of the moving stage 14 can be derived from the change of the sequence and pulse width.

Figure 6:
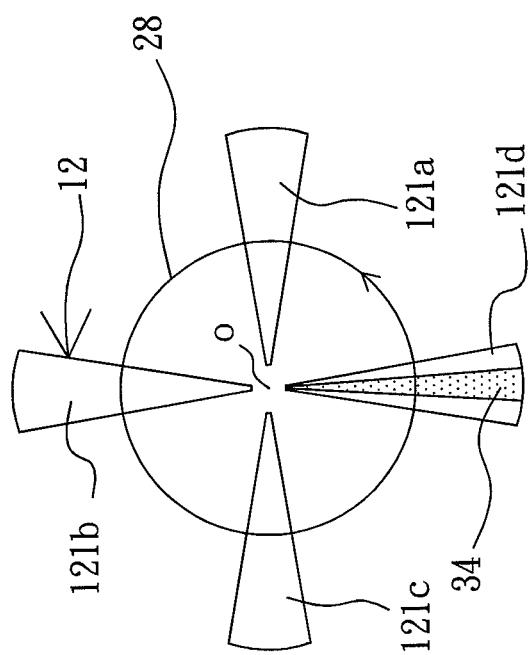
FIG. 6 is a schematic diagram illustrating the designed pattern and the circle trace scanning according to another embodiment of the present invention.
Figure 7:
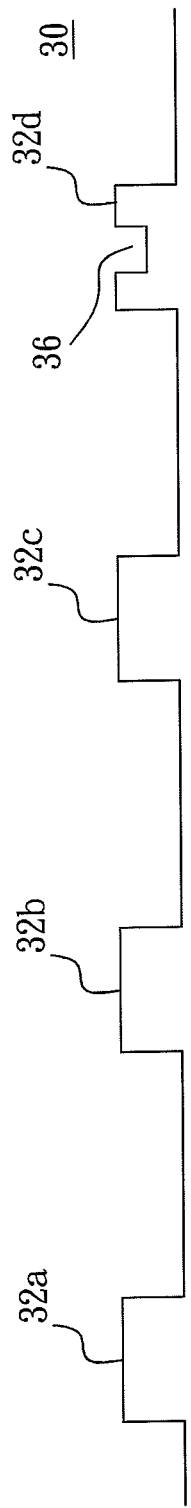
FIG. 7 is a schematic diagram illustrating the clock signal according to another embodiment of the present invention.

Continuing the description above, in order to distinguish sequence relationship between the each pulse 32 of the clock signal 30 for better analysis, there is at least a groove formed on one of the fan-shaped markers 121; when the focused electron beam 18 scans over the fan-shaped marker 121 with the groove, the pulse 32 is not a smooth square wave but a rough square wave. FIG. 6 shows a schematic diagram illustrating the designed pattern 12 and the circle trace scanning 28 according to another embodiment of the present invention, wherein the designed pattern 12 comprises the four fan-shaped markers 121a, 121b, 121c, and 121d and there is a groove 34 formed on the fan-shaped marker 121d. FIG. 7 shows a schematic diagram illustrating the clock signal 30 according to another embodiment of the present invention, wherein the focused electron beam 18 scans over the designed pattern as shown in FIG. 6 and the center of the circle trace scanning 28 corresponds to the radiating center o of the four fan-shaped markers 121a, 121b, 121c, and 121d. As shown in FIG. 7, the width of the each pulse 32a, 32b, 32c, 32d of the clock signal 30 and the distance therebetween is equal, wherein a fluctuation 36 appears over the wave top of the pulse 36 due to the groove 34 of the fan-shaped marker 121d, thereby confirming the corresponding relationship between the four fan-shaped markers 121a, 121b, 121c, 121d and the each pulse 32a, 32b, 32c, 32d of the clock signal 30.

Distinguishing standard, that is to say, the corresponding relationship between the fan-shaped markers and the clock signal, is not limited to the groove 34 formed on the fan-shaped marker 121; it also can be protrusion formed thereon. On the other hand, the fan angle of the fan-shaped marker may be too large or too small for sequencing the clock signal 30 so that a 45 degree fan angle of the fan-shaped marker 121 is designed for reducing deviation according to one embodiment.

Figure 8A:
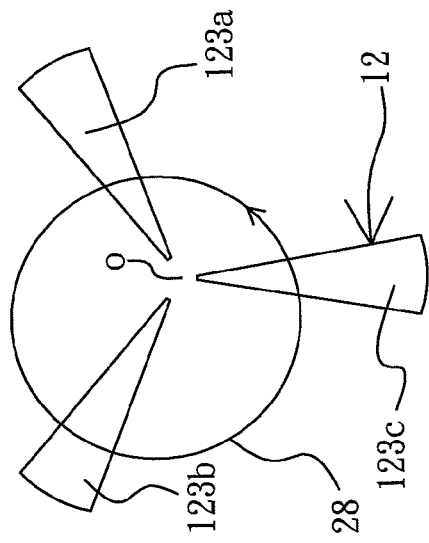
FIG. 8a and FIG. 8b are schematic diagrams illustrating the designed pattern and the circle trace scanning according to another embodiment of the present invention.
Figure 8B:
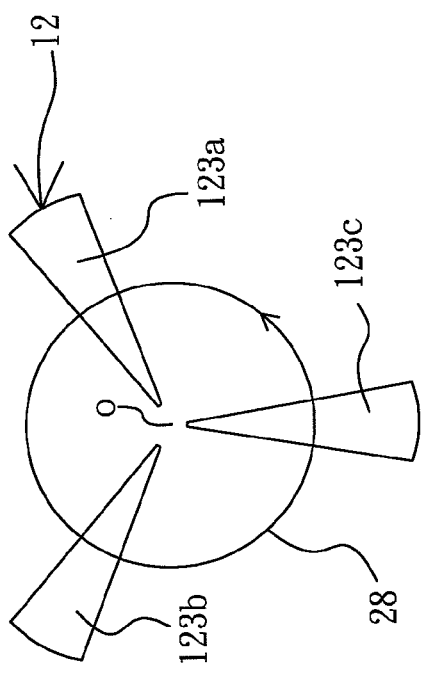

Four gradually wider markers arranged radially according to aforementioned embodiments are exemplified for specifications of the designed pattern, but not limited to this, wherein the designed pattern 12 can comprises two, three, four and above gradually wider markers. FIG. 8a and FIG. 8b shows schematic diagrams illustrating the designed pattern and the circle trace scanning, wherein the designed pattern 12 comprises three fan-shaped markers arranged radially, named the fan-shaped marker 123a, 123b, 123c, which grow wider gradually away from the radiating center o and are arranged with a equal space therebetween.

Figure 9A:
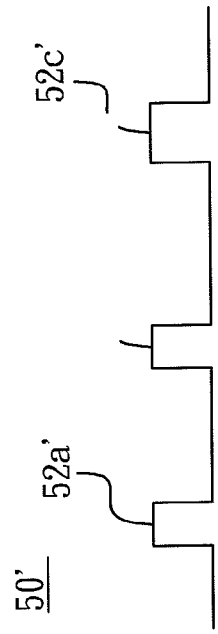
FIG. 9a and FIG. 9b are schematic diagrams illustrating the clock signal generated from the circle trace scanning respectively according to FIG. 8a to FIG. 8b.
Figure 9B:
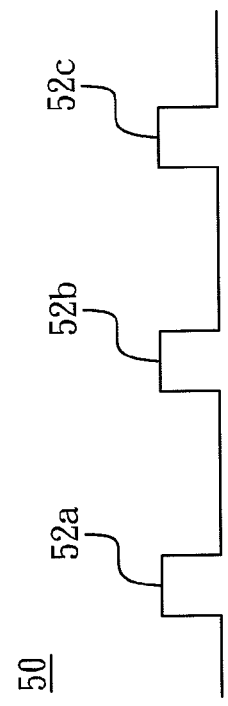

FIG. 9a and FIG. 9b are schematic diagrams illustrating the clock signal 30 generated from the circle trace scanning 28 over the designed pattern 12 respectively according to FIG. 8a to FIG. 8c. If the center of the circle trace scanning 28 corresponds to the radiating center o of the four fan-shaped marks 121a, 121b, and 121c, because the scanning trace of the focused electron beam 18 (as shown in FIG. 1) over each fan-shaped mark 121a, 121b, and 121c is the same (as shown in FIG. 9), the each square pulse 52a, 52b, 52c of the clock signal 30 has equal width and the distance therebetween, which means the corresponding relationship between the designed pattern 12 and clock signal 30 is correct and therefore the clock signal 30 is correct. When there is offset generated to the moving stage, as shown in FIG. 9b, the trace of the circle trace scanning 28 of the focused electron beam 18 over the fan-shaped markers 123a, 123b, and 123c changes, and the width of the pulse 52a', 52b' and 52c' also changes; offset of the moving stage 14 can be deprived from vector projection calculation based on change of pulse width and sequence.

In the present invention, spot size of the focused electron beam generated from the electron beam column depends on resolution of the positioning system for a precise stage; current value of the focused electron beam is used for determining signal-to-noise ratio. Besides, in order to increase signal-to-noise ratio, multi-petal gradually wider markers can be adopted to increase sampling speed while scanning.

Figure 10:
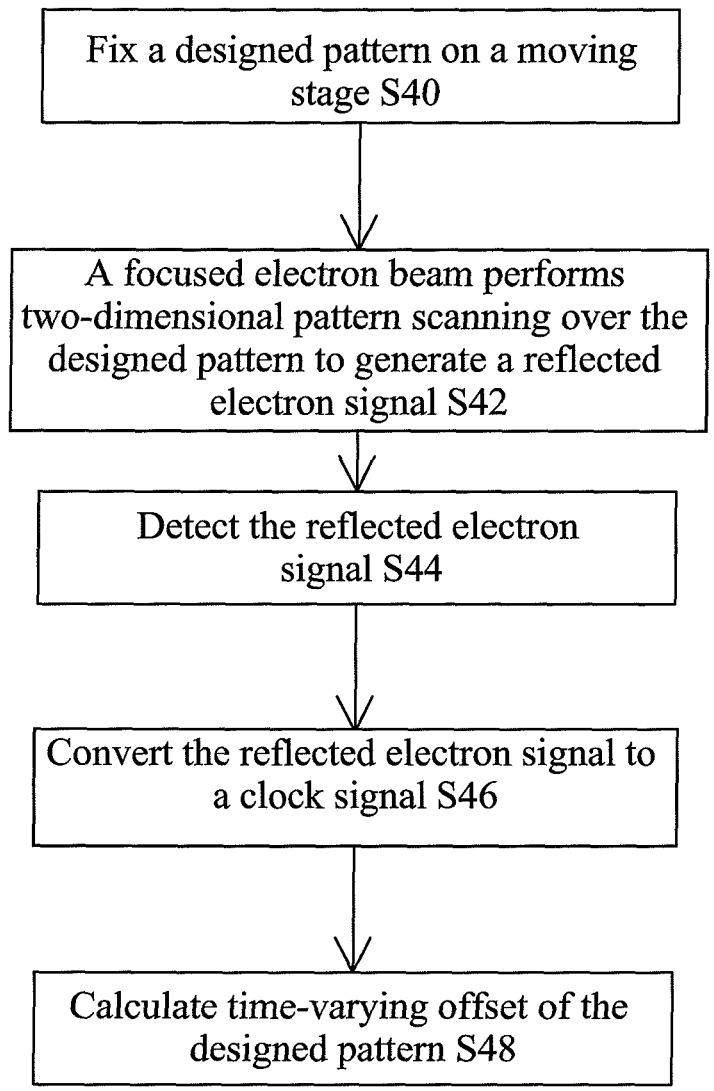
FIG. 10 is a flowchart illustrating the positioning method for a precise stage according to another embodiment of the present invention.

FIG. 10 shows a flowchart illustrating the positioning method for a precise stage according to one embodiment of the present invention, wherein a positioning method for a precise stage comprises: fixing a designed pattern on a moving stage (Step S40), wherein the designed pattern comprises 4 gradually wider markers arranged radially; using a focused electron beam to perform the two-dimensional pattern scanning over the designed pattern to generate a reflected electron signal (Step S42); using an electron detection unit to detect the reflected electron signal (Step S44); converting the reflected electron signal to a clock signal (Step S46); and calculating the time-varying offset of the designed pattern according to the shape of the designed pattern, scanning trace and pulse width of the plurality of clock signals, for adjusting the displacement of the moving stage.

The present invention uses the focused electron beam to scan the specific designed pattern to generate a reflected electron signal and uses the electron detection unit to detect the reflected electron signal, thereby further determining whether there is offset generated to the designed pattern so as to adjust the displacement of the moving stage, which enables default results of the clock signal while scanning the designed pattern via the adjusted scanning trace. This positioning system for a precise stage can be applied to nanoscale positioning of the multi-dimensional moving stage with complex structure and overcome the problem of mechanical drift when the stage is rotating or multi-axis positioning.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A positioning system for a precise stage comprising:
a designed pattern, placed on a moving stage, comprising a plurality of gradually wider marks arranged radially with a space therebetween;
an electron beam column, for generating a focused electron beam;
a scanning unit connected to the electron beam column, for adjusting the focused electron beam to perform two-dimensional pattern scanning over the designed pattern so as to generate a reflected electron signal;
an electron detection unit, for detecting the reflected electron signal; and
a control unit connected to the moving stage, the electron beam column, the scanning unit and the electron detection unit, wherein the reflected electron signal is generated from the two-dimensional pattern scanning of the focused electron beam over the gradually wider marks and the space therebetween; the reflected electron signal is converted by the control unit to generate a clock signal and the control unit adjusts the movement of the moving stage according to pulse width of the plurality of clock signals.

2. The positioning system for a precise stage according to claim 1, wherein each of the wider marks is a fan-shaped mark.

3. The positioning system for a precise stage according to claim 2, wherein the designed pattern comprises four fan-shaped marks.

4. The positioning system for a precise stage according to claim 2, wherein the designed pattern comprises three fan-shaped marks.

5. The positioning system for a precise stage according to claim 1, wherein at least one groove is formed on at least one surface of the gradually wider marks.

6. The positioning system for a precise stage according to claim 1, wherein the two-dimensional pattern scanning is a circle or ellipse trace scanning and the designed pattern is scanned along the circle or ellipse trace.

7. The positioning system for a precise stage according to claim 1, wherein the reflected electron signal comprises secondary electron signals and backscattered electron signals.

8. A designed pattern applied to a positioning system for a precise stage, wherein the designed pattern is placed on a moving stage and is maintained a constant distance from a specimen placed on the moving stage, said designed pattern comprising:
a plurality of gradually wider marks radially arranged with a space therebetween.

9. The designed pattern according to claim 8, wherein the gradually wider marks are arranged radially around a radiating center, and each of the gradually wider marks grows wider toward the direction away from the radiating center.

10. The designed pattern according to claim 8, wherein each of the gradually wider marks is a fan-shaped mark.

11. The designed pattern according to claim 10, wherein the designed pattern comprises four fan-shaped marks.

12. The designed pattern according to claim 10, wherein the designed pattern comprises three fan-shaped marks.

13. The designed pattern according to claim 8, wherein at least one groove is formed on at least one surface of the gradually wider marks.

14. The designed pattern according to claim 8, wherein the gradually wider marks are arranged radially with equal space therebetween.

15. A positioning method for a precise stage comprising:
fixing a designed pattern on a moving stage, wherein the designed pattern comprises a plurality of gradually wider marks arranged radially with a space therebetween;
using a focused electron beam to perform two-dimensional pattern scanning over the designed pattern to generate a reflected electron signal;
detecting the reflected electron signal; and
converting the reflected electron signal to a clock signal and adjusting the movement of the moving stage according to the designed pattern, the two-dimensional pattern scanning and pulse width of the plurality of the clock signals.

16. The positioning method for a precise stage, wherein the two-dimensional pattern scanning is a circle or ellipse trace scanning and the designed pattern is scanned along the circle or ellipse trace.

17. The positioning method for a precise stage according to claim 15, wherein the reflected electron signal comprises secondary electron signals and backscattered electron signals.

18. The designed pattern according to claim 15, wherein the gradually wider marks are arranged radially around a radiating center, and each of the gradually wider marks grows wider toward the direction away from the radiating center.

19. The positioning method for a precise stage according to claim 15, wherein each of the wider marks is a fan-shaped mark.

20. The positioning method for a precise stage according to claim 19, wherein the designed pattern comprises four fan-shaped marks.

21. The positioning method for a precise stage according to claim 19, wherein the designed pattern comprises three fan-shaped marks.

22. The positioning method for a precise stage according to claim 15, wherein at least one groove is formed on at least one surface of the gradually wider marks.

23. The positioning method for a precise stage according to claim 15, wherein the gradually wider marks are arranged radially with equal space therebetween.

* * * * *